(12) United States Patent
Crippen et al.

(10) Patent No.: US 9,360,502 B2
(45) Date of Patent: Jun. 7, 2016

(54) INCREASING CURRENT CARRYING CAPABILITY THROUGH DIRECT LIQUID COOLING OF TEST CONTACTS

(75) Inventors: Warren S. Crippen, Aloha, OR (US); Brett Grossman, Forest Grove, OR (US); Roy E. Swart, Hillsboro, OR (US); Pooya Tadayon, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 61 days.

(21) Appl. No.: 13/976,013

(22) PCT Filed: Dec. 31, 2011

(86) PCT No.: PCT/US2011/068272
§ 371 (c)(1),
(2), (4) Date: Jun. 25, 2013

(87) PCT Pub. No.: WO2013/101239
PCT Pub. Date: Jul. 4, 2013

(65) Prior Publication Data
US 2014/0210499 A1    Jul. 31, 2014

(51) Int. Cl.
G01R 31/10 (2006.01)
G01R 1/44 (2006.01)
G01R 31/28 (2006.01)
G01R 1/067 (2006.01)

(52) U.S. Cl.
CPC *G01R 1/44* (2013.01); *G01R 1/067* (2013.01); *G01R 31/2877* (2013.01)

(58) Field of Classification Search
CPC ...... G01R 31/2877; G01R 31/26; G01R 1/44; G01R 1/67
See application file for complete search history.

(56) References Cited

U.S. PATENT DOCUMENTS

| | | | |
|---|---|---|---|
| 4,871,965 A | 10/1989 | Elbert et al. | |
| 5,198,753 A | 3/1993 | Hamburgen | |
| 5,550,482 A * | 8/1996 | Sano | 324/750.19 |
| 6,194,907 B1 * | 2/2001 | Kanao et al. | 324/750.08 |
| 6,373,271 B1 | 4/2002 | Miller et al. | |
| 6,586,955 B2 | 7/2003 | Fjelstad et al. | |
| 6,891,385 B2 * | 5/2005 | Miller | 324/750.08 |
| 7,170,276 B2 * | 1/2007 | Park et al. | 324/750.08 |
| 7,195,503 B2 | 3/2007 | Eldridge | |
| 9,046,569 B2 | 6/2015 | Kirby et al. | |
| 2007/0197062 A1 | 8/2007 | Bagley et al. | |

(Continued)

OTHER PUBLICATIONS

International Search Report and Written Opinion for International Application No. PCT/US2011/068272, dated Jul. 16, 2012, 9 pp.

(Continued)

*Primary Examiner* — Minh N Tang
(74) *Attorney, Agent, or Firm* — Konrad Raynes Davda & Victor LLP; Alan S. Raynes

(57) ABSTRACT

Testing methods and systems are described. One method for testing an electronic device includes providing a probe in electrical contact with a device. The method also includes positioning an interface of the probe and the device in a liquid medium. The method also includes transmitting a current from the probe through the interface while the interface is in the liquid medium. Other embodiments are described and claimed.

23 Claims, 3 Drawing Sheets

(56) References Cited

U.S. PATENT DOCUMENTS

| | | | |
|---|---|---|---|
| 2008/0246499 A1* | 10/2008 | Kollwitz et al. | 324/760 |
| 2010/0141287 A1 | 6/2010 | Scocchetti | |
| 2010/0141288 A1 | 6/2010 | Di Lello | |
| 2011/0121848 A1 | 5/2011 | Komoto et al. | |
| 2014/0125367 A1 | 5/2014 | Kirby et al. | |
| 2014/0262129 A1 | 9/2014 | Li et al. | |

OTHER PUBLICATIONS

International Preliminary Report on Patentability (IPRP) for International Application No. PCT/US2011/068272, dated Jul. 10, 2014, 6 pp.

Office Action 1 for U.S. Appl. No. 13/844,192, dated Oct. 9, 2015, 10 pp.

Response to Office Action 1 for U.S. Appl. No. 13/844,192, dated Jan. 11, 2016, 9 pp.

* cited by examiner

INCREASING CURRENT CARRYING CAPABILITY THROUGH DIRECT LIQUID COOLING OF TEST CONTACTS

BACKGROUND

Wafer probes are typically used to provide an electrical path between a test system and circuits on a wafer, thereby permitting the testing and validation of the circuits at the wafer level, before they are diced and packaged. As technology further develops and the contact pitch on devices decreases, the cross section of the probes also decreases.

BRIEF DESCRIPTION OF THE DRAWINGS

Embodiments are described by way of example, with reference to the accompanying drawings, which are not drawn to scale.

DETAILED DESCRIPTION

Figure 1:
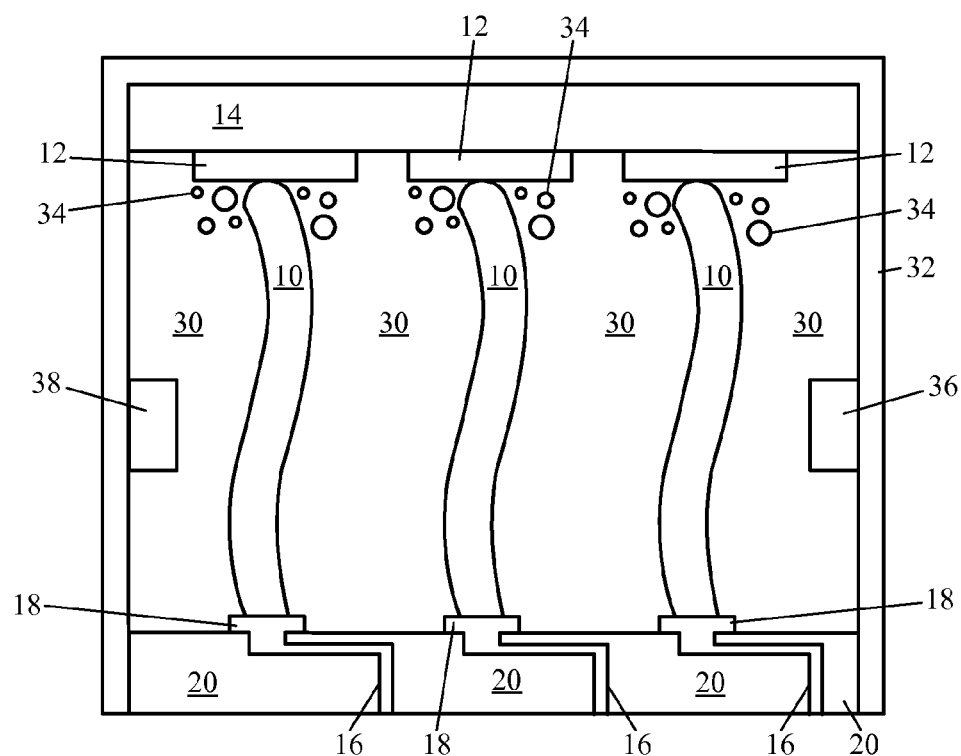
FIG. 1 illustrates a cross-sectional view of a test assembly including a plurality of probes in contact with contact pads of a device to be tested, in accordance with certain embodiments.

Reference below will be made to the drawings wherein like structures may be provided with like reference designations. In order to show the structures of various embodiments most clearly, the drawings included herein include diagrammatic representations of various structures. Thus, the actual appearance of the fabricated structures may appear different while still incorporating the claimed structures of the illustrated embodiments. Moreover, the drawings may show only the structures necessary to understand the illustrated embodiments. Additional structures known in the art have not been included to maintain the clarity of the drawings.

As a test probe cross section is reduced, the ability of the probe to carry current to a device is also reduced. This is because a reduced cross section leads to a higher resistance, which results in the probe heating up during application of current during testing. The greater the current load the system carries, the greater the heat that is generated, and the greater the heat that needs to be removed in order to prevent damage to the probe. If the heat generated increases to high enough levels, mechanical and structural changes to the probe material may result in plastic deformation of the probe, reducing contact force and leading to possible catastrophic failure of the probe. Portions of the probe may even melt if sufficient heat is generated. Air, while being an effective dielectric medium in which to conduct testing, is not very efficient at removing heat generated from current load under test. With a gas medium such as air, the main mechanism for heat removal is convection.

Certain embodiments provide a significant improvement in current carrying capability. Such embodiments include the use of a liquid medium during the testing instead of a gas medium.

In accordance with certain embodiments, changing the medium from air or another gas to a low dielectric, high heat conductivity liquid improves the efficiency of the heat removal by facilitating the change in mechanism from convection to conduction. The liquid may act as a heat conductor, channeling the heat away from the contact device into the liquid. Positioning all or part of the contact device (for example, a sort probe) and the interface where the probe contacts the device under test in a liquid medium provides for a more efficient removal of heat generated by electrical resistance in the system than in a gas medium. Utilizing an appropriate liquid medium may in certain embodiments improve the cooling of the contact device to a level so that the maximum current it can carry increases substantially, without a significant change in the integrity of the signal generated during the test. In certain embodiments, testing in a static liquid environment may allow for upwards of a 100% improvement in the current carrying capability of a contact device when compared to testing in air. Additional embodiments, including the operations of circulating the liquid and cooling the liquid, may allow for even larger improvements in the current carrying capability.

FIG. 1 illustrates a cross-sectional view of a test assembly including a plurality of probes 10 positioned so that one end is in contact with a contact pad 12 of a device 14 to be tested. The device 14 may in certain embodiments be a wafer having integrated circuits formed thereon. The device 14 may be tested by applying a current through the probes 10 to the contact pads 12 on the device 14. The current may travel through the pathways 16 in a test head 20 to reach contacts 18 that the probes 10 are in electrical contact with. As illustrated in the embodiment illustrated in FIG. 1, the probes 10 and the contact pads 12 are positioned in liquid medium 30. The assembly of FIG. 1 also includes a container 32 configured to house the liquid medium 30 that is in contact with the probes 10 and device 14 to be tested.

During testing, heat generated by resistance will be removed through the liquid medium 30. If the heat is high enough, the medium may start to boil at regions of high load and high heat transfer, as indicated by bubbles 34. In certain embodiments, the configuration of the probe and the contact pad are such that a maximum location of heat generation is near the interface of the probe 10 and contact pad 12. The bubbles 34 may form at or near the interface. Other embodiments may include a maximum location of heat generation that is spaced a distance away from the interface between the probe 10 and contact pad 12. Among the factors that may influence where the highest heat is located may include, for example, the shape and cross-sectional area of the probe 10 and of the contact pad 12. Testing has shown that a substantially greater increase in current carrying capability may be obtained in a liquid medium when compared to a medium of air. The current carrying capability may be further enhanced by inducing a liquid flow through the system. This may be accomplished using any suitable device, such as a pump mechanism 36. The current carrying capability may also be enhanced by cooling the liquid in the system. This may be accomplished using any suitable cooling mechanism 38.

Figure 2:
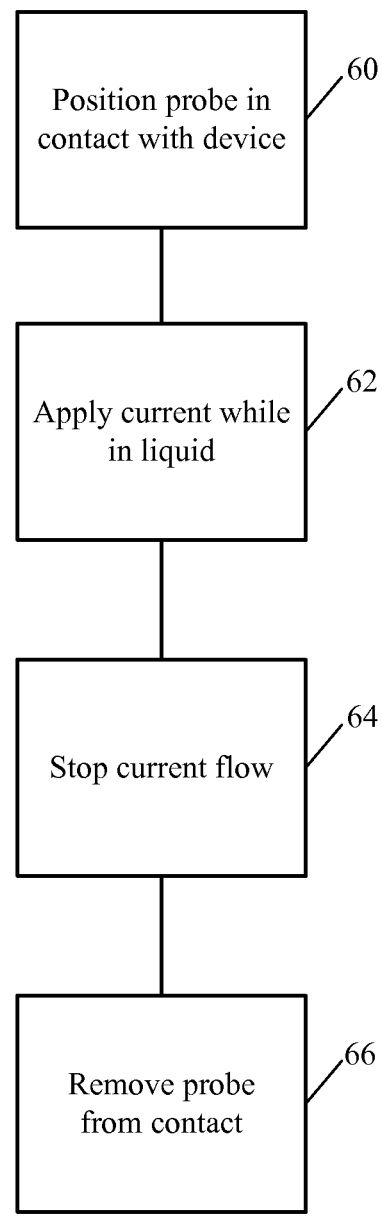
FIG. 2 illustrates a flowchart of operations including testing in a liquid medium, in accordance with certain embodiments.

FIG. 2 illustrates a flowchart of operations that may be carried out in accordance with certain embodiments. Box 60 includes positioning a probe in electrical contact with a device to be tested. Box 62 is applying current through the probe to the device to be tested in a liquid medium. In certain embodiments, at least part of the probe and the contact region is in the liquid. Box 64 is stopping the current flow at the end of testing. Box 66 is removing the probe from electrical contact with the device.

Figure 3:
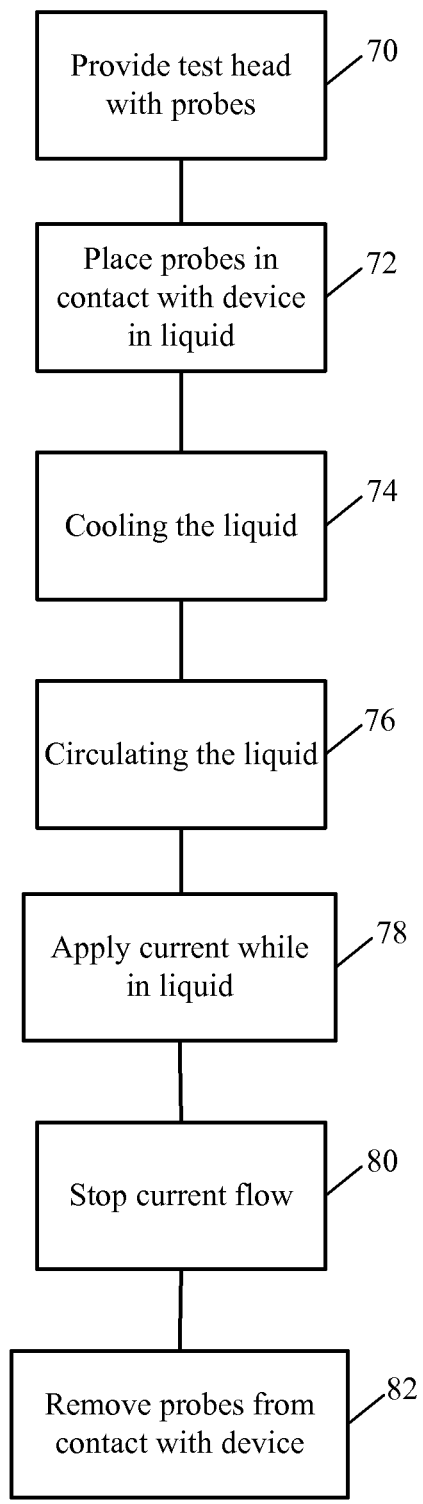
FIG. 3 illustrates a flowchart of operations including the use of a test head with probes and testing in a liquid medium, in accordance with certain embodiments.

FIG. 3 illustrates another flowchart of operations that may be carried out in accordance with certain embodiments. Box 70 includes providing a test head including a plurality of probes positioned therein. Box 72 is positioning the test head and device to be tested so that the probes are in electrical contact with the device to be tested in a liquid. Box 74 is cooling the liquid. Box 76 is circulating the liquid. Box 78 is applying current through the probes to the device to test the device while the probes and contact region are positioned in the cooled and circulating liquid. Box 80 is stopping the current flow to stop the application of current at the end of testing. Box 82 is moving the test head relative to the device so the probes are removed from electrical contact with the device.

Various modifications to the above operations may be made, with certain operations being optional. For example, in certain embodiments, one or both of the cooling the liquid and circulating the liquid need not be performed.

Embodiments may utilize any liquid with suitable dielectric and heat transfer properties. Examples include, but are not limited to, low dielectric liquids, including, but not limited to, halogenated liquids. Water has a relatively high dielectric constant, which means that it is a relatively good conductor of electricity. As a result, the use of aqueous liquids may result in electrical shorting between probes or contact pads. Examples of certain halogenated liquids include various Fluorinert™ fluids and Novec™ fluids, available from 3M, including Novec™ engineered fluid HFE-7100 and Fluorinert™ electronic fluids FC-70, FC-40, and FC-3283.

Testing was carried out in air and in various liquids to determine an amount of applied current that caused mechanical damage to a probe. The tests were carried out at room temperature, with a test scheme of a constant current pulse, 1 second on and 1 second off at a given current step, with the pulse repeated 5 times per run, with the run repeated 5 times per current step starting at 0.5 amps and ending at failure of the probe. The tests were conducted on a 20 probe coupon of Vertex Probes (MEMS probes constructed of Ni—Co (nickel-cobalt)). The response variable used was percent reduction in gram force, which is an indicator of plastic deformation (damage) to the probe. When tested in a liquid, the liquid was static within the container. Probes were tested in air, halogenated liquids, and aqueous liquids. The halogenated liquids included the Flourinert™ fluids and Novec™ fluids listed above. The aqueous liquid used included Feser One fluid, available from the Feser Company.

The results indicated that the probes tested in air showed the lowest current levels at which damage to the probes occurred. The probes tested in the halogenated liquids showed about twice the current at which damage to the probes occurred when compared to the probes tested in air. The probes tested in aqueous liquid showed the highest current when damage to the probes occurred. Of the environments the tests were carried out in, air has the lowest rate of heat transfer, followed by the halogenated liquids, followed by the aqueous liquids. Also, air has the lowest dielectric constant, followed by the halogenated liquids, followed by the aqueous liquids. This means that air is the most electrically insulating, followed by the halogenated liquids, followed by the aqueous liquids. While the aqueous liquids showed the highest current when damage to the probes occurred, they also have a level of electrical conductivity that is relatively high, which leads to shorting between adjacent probes or contact pads.

Tests were also done to determine whether replacing the existing dielectric material (air) with a different medium (liquid) would impact signal integrity through the probe array. The primary response variable considered was insertion loss (measured in dB). The results indicated that an environment of air has the smallest insertion loss, followed by the halogenated liquids, followed by the aqueous liquid, which had a substantially greater insertion loss.

In sum, the test results indicated that the use of low dielectric liquids such as halogenated liquids permits the delivery of a greater current to the device to a device under test, when compared with testing performed in air. While the signal loss was higher in the low dielectric liquids tested, it is still within generally acceptable bounds. The test results also indicate that for the aqueous liquid tested, the greater heat transfer properties are generally offset by unfavorable electrical properties.

Additional enhancements are possible in certain embodiments by chilling the environment the testing is carried out in. Lower temperatures will promote higher heat transfer away from the probe and the contact pad. This may be particularly enhanced in a liquid medium. As illustrated in FIG. 1, a cooling mechanism 38 may be positioned to cool the liquid 30 in the container 32. In certain embodiments, the liquid is cooled to a temperature close to its freezing point, to provide for a maximum amount of heat transfer while still being in a liquid medium. Certain embodiments utilize the liquid cooled to within about 10° C. of its freezing point.

As noted above, additional enhancements are also possible in certain embodiments by providing a flow of the testing medium over the probes and contact pads. For example, as noted above and in the embodiment illustrated in FIG. 1, a pump mechanism 36 may be used to circulate the liquid though the container and over the probes and contact pads.

A variety of different assembly configurations and component geometries may be used in various embodiments. For example, in certain embodiments, it may be necessary to only house a portion of the probe 10 in the liquid medium, for example, at and near the interface between the probe 10 and contact pad 12. In other embodiments, the configuration may be such that only certain probes are in contact with the liquid medium at a particular time, and other probes are not. In other embodiments, all the probes are in contact with the liquid during the entire test procedure. Embodiments may be applicable to the testing of any kind of electronic device that is tested with a probe.

The structures of various features in embodiments may be varied from those shown and described herein. In addition, embodiments may be manufactured, used, and contained in a variety of positions and orientations.

In the foregoing Detailed Description, various features are grouped together for the purpose of streamlining the disclosure. This method of disclosure is not to be interpreted as reflecting an intention that the claimed embodiments of the invention require more features than are expressly recited in each claim. Rather, as the following claims reflect, inventive subject matter may lie in less than all features of a single disclosed embodiment. Thus the following claims are hereby incorporated into the Detailed Description, with each claim standing on its own as a separate embodiment.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:
1. A method for testing an electronic device, comprising:
   providing a probe in electrical contact with a device;
   positioning an interface of the probe and the device so that the interface is surrounded by a liquid medium;
   transmitting a current from the probe through the interface while the interface is surrounded by the liquid medium; and controlling the transmitting the current to generate heat so that an amount of the liquid medium boils.

2. The method of claim 1, wherein the probe has a length and at least part of the length of the probe is in the liquid medium during the transmitting the current.

3. The method of claim 1, wherein the probe has a length and the entire length of the probe is in the liquid medium.

4. The method of claim 1, wherein the probe is positioned in a test head, and the test head is positioned in the liquid medium.

5. The method of claim 1, wherein the liquid medium is a halogenated liquid.

6. The method of claim 1, further comprising circulating the liquid medium over the interface during the transmitting the current.

7. The method of claim 1, further comprising cooling the liquid medium during the transmitting the current.

8. The method of claim 1, further comprising providing the liquid medium at a temperature within 10° C. of its freezing temperature during the transmitting the current.

9. The method of claim 1, further comprising circulating the liquid medium over the interface and providing the liquid medium at a temperature within 10° C. of its freezing temperature during the transmitting the current.

10. A method comprising:
    positioning a plurality of test probes in electrical contact with a device, the test probes each having a length; and
    conducting electrical testing of the device while at least a portion of the length of the test probes is in a liquid medium comprising a halogenated liquid; wherein the conducting electrical testing comprises applying a sufficient current through the test probes so that heat is generated in the liquid medium and a quantity of the liquid medium is boiled.

11. The method of claim 10, wherein the electrical contact between the test probes and the device is on pads, further comprising conducting the electrical testing while the pads are in the liquid medium.

12. The method of claim 11, further comprising circulating a quantity of the liquid medium over an interface of the test probes and the pads during the electrical testing.

13. The method of claim 12, further comprising providing the liquid medium at a temperature within 10° C. of its freezing temperature during the electrical testing.

14. The method of claim 12, wherein the quantity of the liquid medium that is boiled is positioned adjacent to the interface.

15. The method of claim 10, wherein the test probes are positioned in a test head, further comprising positioning the test head in the liquid medium during the conducting electrical testing.

16. The method of claim 10, further comprising cooling the liquid medium during the electrical testing.

17. The method of claim 10, further comprising providing the liquid medium at a temperature within 10° C. of its freezing temperature during electrical testing.

18. A system comprising:
    an electronic device including contact regions;
    a testing mechanism including a plurality of test probes, the test probes adapted to touch the contact regions during electrical testing;
    a container, wherein the container is adapted to house the contact regions and at least a portion of the test probes in a liquid medium during the electrical testing; and
    a cooling mechanism adapted to control a temperature of the liquid medium;
    the testing mechanism configured to transmit a sufficient current through the test probes during the electrical testing so that heat is generated in the liquid medium and a quantity of the liquid medium is boiled.

19. The system of claim 18, further comprising a pump adapted to transmit the liquid medium during testing.

20. The system of claim 18, further comprising a test head into which the test probes are positioned.

21. The system of claim 20, wherein the container is sized to hold at least part of the test head in the liquid medium during testing.

22. The system of claim 21, wherein the container is sized to contain a wafer on which the electronic device is located.

23. The system of claim 18, further comprising a quantity of the liquid medium in the container, the liquid medium comprising a halogenated material.

* * * * *